United States Patent [19]

Nishizawa et al.

[11] Patent Number: 5,115,287
[45] Date of Patent: May 19, 1992

[54] STEP-CUT INSULATED GATE STATIC INDUCTION TRANSISTORS AND METHOD OF MANUFACTURING THE SAME

[75] Inventors: Junichi Nishizawa; Nobuo Takeda; Sohbe Suzuki, all of Sendai, Japan

[73] Assignee: Research Development Corporation of Japan, Tokyo, Japan

[21] Appl. No.: 752,934

[22] Filed: Aug. 30, 1991

Related U.S. Application Data

[63] Continuation of Ser. No. 527,677, May 23, 1990, abandoned, which is a continuation of Ser. No. 122,720, Nov. 18, 1987, abandoned.

[30] Foreign Application Priority Data

| Nov. 19, 1986 | [JP] | Japan | 61-273934 |
| Nov. 19, 1986 | [JP] | Japan | 61-273935 |
| Nov. 21, 1986 | [JP] | Japan | 61-276754 |
| Nov. 21, 1986 | [JP] | Japan | 61-276755 |

[51] Int. Cl.$^5$ ............... H01L 29/10; H01L 29/78; H01L 29/06
[52] U.S. Cl. ............... 357/23.4; 357/23.12; 357/41; 357/55
[58] Field of Search ............ 357/23.4, 55, 23.12, 357/41

[56] References Cited

U.S. PATENT DOCUMENTS

Re. 29,971  4/1979  Nishizawa et al. .
4,427,990  1/1984  Nishizawa ............... 357/23.4

FOREIGN PATENT DOCUMENTS

| 53-142189 | 12/1978 | Japan | 357/23.4 |
| 55-65463  | 5/1980  | Japan | 357/23.4 |
| 55-133574 | 10/1980 | Japan | 357/23.4 |
| 57-35591  | 7/1982  | Japan . |
| 58-56270  | 12/1983 | Japan . |
| 59-186371 | 10/1984 | Japan | 357/23.4 |
| 60-28394  | 7/1985  | Japan . |

OTHER PUBLICATIONS

Chang et al, "Vertical FET Random-Access Memories with Deep Trench Isolation", IBM Technical Disclosure Bulletin, vol. 22, No. 8B, Jan. 1980.

*Primary Examiner*—Andrew J. James
*Assistant Examiner*—Ngan Van Ngo
*Attorney, Agent, or Firm*—Armstrong, Nikaido, Marmelstein, Kubovcik & Murray

[57] ABSTRACT

A step-cut insulated gate static induction transistor can accurately make a channel length and a gate length and is excellent as a high speed transistor but is greatly affected by a deviation in mask alignment in the manufacturing process. This invention utilizes the fact that a gate portion formed in a previous processes is used as a mask in a post portion to thereby self-adjustably form the post portion, thus eliminating the influence of the deveation in mask alignment. In addition, a construction has been invented in which a current flowing through a portion apart from a gate between a drain and a source can be restricted. The aforesaid manufacturing method is also used for this improved construction.

8 Claims, 12 Drawing Sheets

PRIOR ART

STEP-CUT INSULATED GATE STATIC INDUCTION TRANSISTORS AND METHOD OF MANUFACTURING THE SAME

This application is a continuation of application Ser. No. 527,677 field May 23, 1990 now abandoned, which in turn is a continuation of application Ser. No. 122,720 filed Nov. 18, 1987, now abandoned.

BACKGROUND OF THE INVENTION

1. Field of the Invention

This invention relates to a step-cut insulated gate static induction transistor capable of carrying out high-speed switching, a high-speed and low power step-cut insulated gate static induction transistor integrated circuit, and method of manufacturing the same.

2. Description of the Prior Art

Insulated gate transistors for high frequency amplification and integrated circuits have been heretofore used but have a disadvantage that the drivability is small. For example, a complementary metal-oxide semiconductor transistor integrated circuit (C-MOS) has been known as an application of an insulated gate transistor. However, This circuit (C-MOS) operates at low dissipation power but operates at switching speed, because of small drivability to overcome such disadvantages as noted above, one of the present inventors has previously proposed an insulated gate static induction transistor (for example, see Japanese Patent Application No. 1756/1977) and a step-cut insulated gate static induction transistor (for example, see Japanese Patent Application No. 13,707/1977). The insulated gate static induction transistor is designed so that the depletion layer spread from the drain regions reaches the source region. Thus, a current flowing from source to drain is controlled not only by the gate voltage but also by the drain voltage and the current flows not only into an interface between a semiconductor and an insulator but also into a substrate. Therefore, the insulated gate static induction transistor has monsaturating current-voltage characteristics and has large drivability. Particularly, the step-cut insulated gate static induction transistor has a channel formed depthwise of a semiconductor substrate, thus providing a good controllability for a channel length and a gate length, and the just described transistor is well suited for shortening a channel to improve its drivability. Thus, the step-cut insulated gate static induction transistor is able to increase its drivability and decrease a parasitic capacitance and therefore exhibits an excellent performance as a high speed switching transistor and a high-speed and low power integrated circuit.

Prior art will be described hereinafter with reference to FIG. 1. FIG. 1(a) shows an example of a construction in section of a conventional step-cut insulated gate static induction transistor. In FIG. 1(a), reference number 10 designates a semiconductor substrate, a main surface of which is partly provided with a U-shaped groove A drain region 11, a channel region 13 and a source region 12 are provided in this order depthwise from the main surface along the side wall of the U-shaped groove, and a drain electrode 11' is connected to the drain region 11 A source electrode, which is not shown, is provided vertically as viewed from the paper surface The drain region 11 and the source region 12 have the impurity concentration of the order of $10^{18}$ to $10^{21} cm^{-3}$, the conductivity type of which is shown as a P type, but an N type can be used. In addition, the region 11 can be used as a source region and the region 12 can used as a drain region The channel region 13 has the impurity concentration of the order of $10^{12}$ to $10^{16} cm^{-3}$, the conductivity type of which can be of the same as or opposite to that of the drain region 11 and the source region 12, and a multi-layered construction can be also employed. The impurity concentration as well as the depth of the aforesaid U-shaped groove are determined so that a depletion layer spread from the drain region 11 reaches the source region 12 in at least a part of the operating condition thereof. A gate insulator 14 such as an oxide film is provided in contact with the channel region 13 and has a thickness of the order of 100 to 1,000 Å. On the side opposite the gate insulator 14 is provided a gate electrode 14' formed of metal, polycrystalline silicon or the like. Reference number 15 designates a field oxide film. Since a conventional step-cut insulated gate static conduction transistor as shown in FIG. 1(a) is formed depthwise with respect to a semiconductor substrate. dimensions of a transistor can be controlled with precision for deposition and etching, thereby providing a good means for controlling the channel length and gate length and being well suited for shortening the channel to thereby improve drivability Accordingly, such a transistor, as noted above, has a large drivability and can decrease a parasitic capacitance and therefore exhibits an excellent performance as a high speed switching transistor and a high speed low power integrated circuit.

One example of a well known fabrication process for manufacturing the aforesaid step-cut insulated gate static conduction transistor will be described with reference to FIG. 2.

FIG. 2(a)

An epitaxial layer 22 constituting a channel is grown on a semiconductor substrate 21 used as a drain, a channel impurity is introduced by thermal diffusion or ion implantation and thereafter a U-shaped groove is formed in a part of a main surface of the semiconductor substrate by anisotropic plasma etching or the like.

FIG. 2(b)

A conventional photolithography and a selective oxidation are used to form a field oxide film 23 and windows, which are provided in a part of a main surface of a semiconductor substrate and in a part of the side wall of a U-shaped groove to form a gate oxide film 24.

FIG. 2(c)

A polycrystalline silicon 25 constituting a gate electrode is deposited and subjected to etching by a conventional photolithography so as to have it remained on a gate oxide film of the side wall of a U-shaped groove, diffusion or ion implantation.

FIG. 2(d)

A passivation film 27 is deposited and contact hole is opened to form a drain electrode 21', a gate electrode 25' and a source electrode 26'.

The impurity concentration of the aforesaid drain region 21 and source region 26 is of the order of $10^{18}$ to $10^{21} cm^{-3}$. It is noted of course that the conductive type can be of either P type or N type, and the portion designated by reference number 21 can be used as a source region and the portion designated by reference number 26 as a drain region conversely to the former. The impurity concentration of the channel region 22 is of the order of $10^{12}$ to $10^{16}$cm$^{-3}$, and the conductive type thereof can be the same as or opposite to that of the aforementioned drain region and source region, a multilayered construction being possibly used. However, at least in a part of the operating condition a depletion layer spread from the drain region must reach the source region, and to meet this requirement, the impurity concentration thereof as well as the depth of the U-shaped groove are determined. The thickness of the gate oxide film 24 is set to be of the order of 100 to 1,000 Å, and the gate electrode is ordinarily formed of polycrystalline silicon or the like, the thickness being of the order of 1000 Å to 1 μm.

In the above-described conventional process of manufacturing, a step-cut insulated gate static induction transistor, a conventional photolithography is used and therefore a margin for mask alignment is required. Consequently, this margin makes it difficult to form the gate electrode 25 only on the side wall of the U-shaped groove.

For example, FIG. 3 shows an example of a plan construction of a conventional step-cut insulated gate static induction transistor, which corresponds to the fabrication process shown in FIG. 2. In FIG. 3, reference number 31 designates a side wall of a U-shaped groove, 32 a window provided by selective oxidation, 33 a gate electrode of a polycrystalline silicon, 34 and 35 a drain contact hole and a gate contact hole, respectively, and 36 and 37 a drain electrode and a gate electrode, respectively. In FIG. 3, the section of B—B' is shown in FIG. 2(d). The reference labels lb and lc denote mask alignment margins with respect to the photolithography of the FIG. 2 processes (b) and (c), the margin being normally designed approximately 0.1 to 2 μm.

An example of the drain current-drain voltage margin lc is shown in FIGS. 4 (a) to (c). In this case, it is designed so that the channel length is approximately 0.5 μm; the dosage of the channel impurity is approximately $1.5 \times 10^{13}$cm$^{-2}$; and the thickness of the gate oxide film is approximately 250 Å, the mask alignment margin lc being 0 μm in FIG. 4(a), and 1 μm and 2 μm in FIGS. 4 (b) and (c), respectively. In FIG. 4 case of the (a), there exhibits the unsaturated type current-voltage characteristic, the drivability is large and the characteristic of the step-cut insulated gate static induction transistor is conspicuous but there is the disadvantage that the yield is poor. On the other hand, in FIG. 4 case of the (b) and (c), since a portion corresponding to the mask alignment margin works similarly to a planar type transistor, the effective channel length becomes extended, thereby deteriorating the drivability.

In the conventional step-cut insulated gate static induction transistor, the drain region 11 is opposed to the source region 12 with the channel region 13 sandwiched therebetween, and therefore if the channel is shortened to attain higher speed, a current flows between drain and source even at a point away from the gate surface by being affected by the drain field. This current component cannot be controlled by a gate voltage. This results in disadvantages that a leak current is large at the off state, etc. For example, FIG. 1 (b) shows an example of the drain current-drain voltage characteristics of a conventional step-cut insulated gate static induction transistor so designed that the channel length is approximately 0.5 μm, the dosage or channel impurity is approximately $2 \times 10^{13}$cm$^{-2}$, and the thickness of the gate oxide film is approximately 250 Å. Even when the gate voltage is 0 Volt, the drain current flows as the drain voltage increases. It is noted of course that such a current flowing on the bulk side can be suppressed to some extent by selecting the impurity concentration of the channel region 3. FIG. 1 (c) shows an example of the drain current - drain voltage characteristics of a conventional step-cut insulated gate static induction transistor so designed that the channel length is approximately 0.5 μm, the dosage of channel impurity is approximately $6 \times 10^{13}$cm$^{-2}$, and the thickness of the gate oxide film is approximately 250 Å. A leak current at the off state was improved but drivability is sacrificed to some extent because the static induction effect on the drain side has become difficult to extend to the source side, and the threshold voltage is increased.

SUMMARY OF THE INVENTION

It is an object of this invention, while eliminating the disadvantages noted above with respect to the aforementioned method of manufacturing step-cut insulated gate static induction transistor, to provide a method of manufacturing a step-cut insulated gate static induction transistor, which can self-adjustably form a gate oxide film and a gate electrode only on the side wall of a U-shaped groove, and increasing reproducibility and reliability.

It is a further object of this invention, while overcoming the disadvantages noted above with respect to the aforementioned step-cut insulated gate static induction transistor to improve the characteristics, to provide an step-cut insulated gate static induction transistor which can carry out higher switching speed, low-power dissipation and the method of manufacturing the same.

An improved method of manufacturing a step-cut insulated gate static induction transistor and its integrated circuit according to this invention is characterized by comprising the processes of anisotropic etching for forming a U-shaped groove in one main surface of a semiconductor substrate, performing selective oxidation while self-adjustably leaving a mask material for selective oxidation only on the side wall of said U-shaped groove, and forming a gate oxide film on a region formed with a window by said selective oxidation.

In addition, a method of patterning said mask material for selective oxidation is characterized by comprising the steps of depositing a silicon nitrided film, self-adjustably leaving a polycrystalline silicon film deposited on said silicon nitride film only on the side wall of said U-shaped groove by anisotropic etching, and using said film as a mask to etch said silicon nitride film.

Therefore, it is possible to form a gate oxide film and a gate electrode without being affected by deviation of mask aligning step, thus improving reproducibility and reliability.

In an improved step-cut insulated gate static induction transistor, both drain region and source region are arranged so as to be free from the provision of a portion where the drain region is opposed to the source region with a channel region sandwiched therebetween. That is, in FIG. 9 (a), a drain region 91 is arranged at the top of a U-shaped groove provided in the surface of a semiconductor substrate 90, and a source region 92 is arranged in contact with the lower end of the side wall of the U-shaped groove and along the bottom of the U-shaped groove.

In such a construction as described above, the distance between the drain and the source increases while moving away from an insulated gate surface 94, and an electric field between the drain and the source in a portion away from the insulated gate 94 is alleviated. As a consequence, a shorter channel may be obtained without increasing a leakage current between the drain and the source, and high speed switching may be carried out, thus providing a step-cut insulated gate static induction transistor with low power dissipation.

A method of manufacturing a step-cut insulated gate static induction transistor constructed as described above also advantageously comprises the steps of anisotropic etching for forming a U-shaped groove in one main surface of a semiconductor substrate, forming a gate oxide film, self-adjustably leaving a gate electrode only on the side wall of said U-shaped groove, and using said gate electrode as a mask material to self-adjustably form a drain region and a source region.

As a consequence, it is possible to form a gate oxide film and a gate electrode, and a source region and a drain region without being affected by deviation of mask alignment step.

In a separately improved construction, as shown in FIG, 15 (a), a channel regions 153 having a low impurity concentration is provided only in the vicinity of a surface of a side wall of a U-shaped groove of a step-cut insulated gate static induction transistor, and a channel region 153' sandwiched between a drain source 151 and a source region 152 on the bulk side is of a high impurity concentration. The impurity concentration of the channel region 153' on the bulk side is so determined that in a normal operating condition a leakage current does not flow between the drain and source under the influence of a drain electric field.

As a consequence, in such a construction as described above, there provides a step-cut insulated gate static induction transistor which can be of a shorter channel to improve drivability without increasing a threshold voltage and without increasing a leak current between the drain and source.

A step-cut insulated gate static induction transistor is also advantageously manufactured, similarly to the former, by the step of self-adjustably forming on the side wall of a U-shaped groove a channel region of low impurity concentration a gate oxide film, gate electrode, a source region and a drain region.

DETAILED DESCRIPTION OF THE PREFERRED EMBODIMENTS

Embodiment 1

Figure 1A:
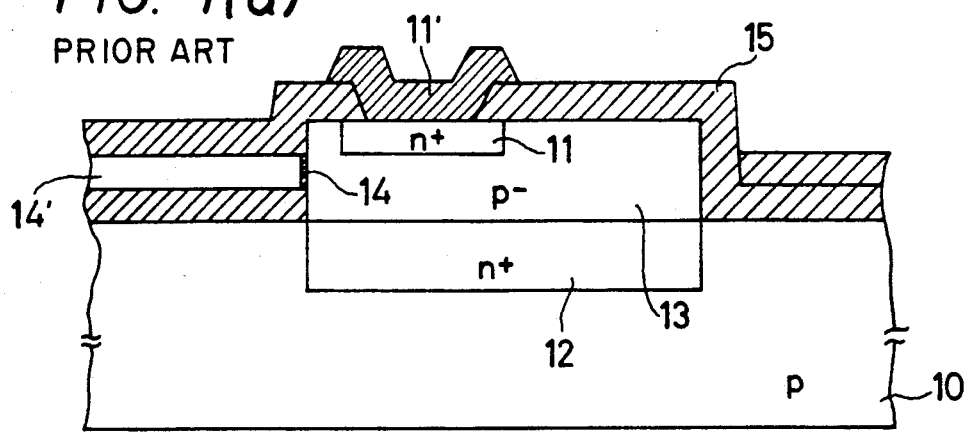
FIGS. 1(a) to 1(c) show one example of a conventional step-cut insulated gate static induction transistor, FIG. 1 (a) showing a sectional structural view, FIG. 1 (b) showing one example of the drain current - drain voltage characteristics, and FIG. 1 (c) showing another example of the drain current-drain voltage characteristics.
Figure 1B:
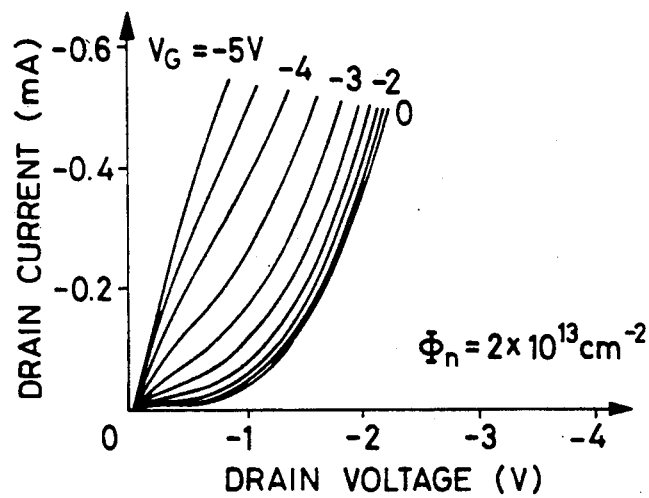
Figure 1C:
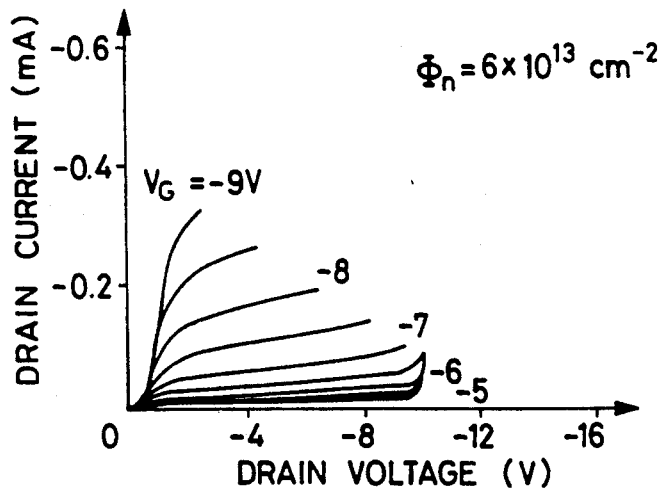
Figure 2A:
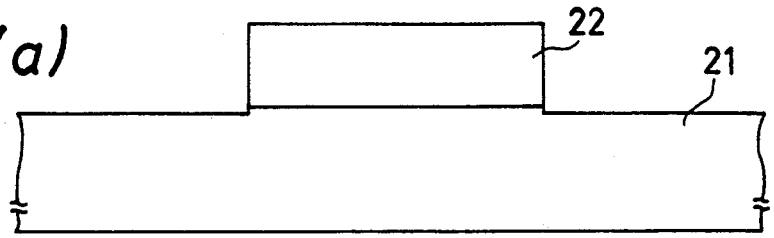
FIGS. 2(a) to 2(d) are explanatory views of the fabrication process showing one example of a conventional method of manufacturing a step-cut insulated gate static induction transistor.
Figure 2B:
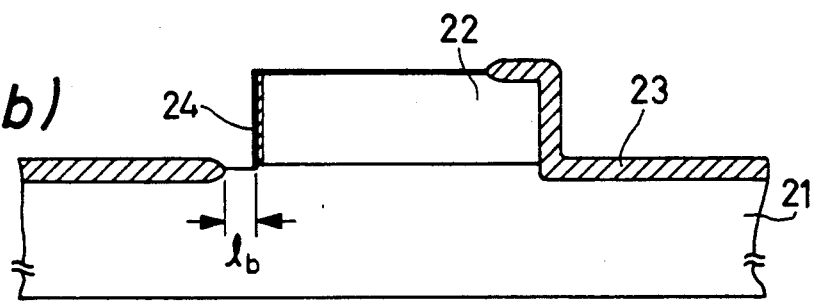
Figure 2C:
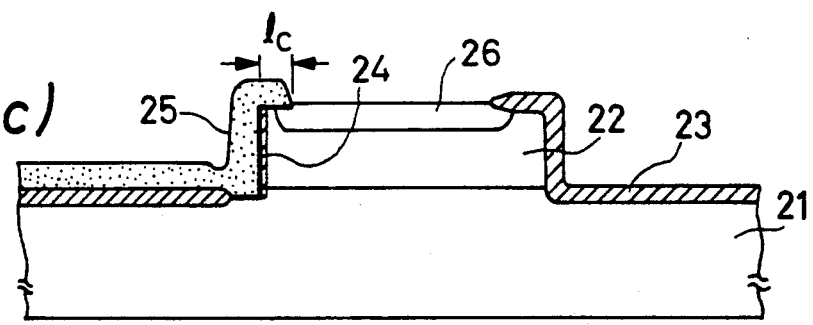
Figure 2D:
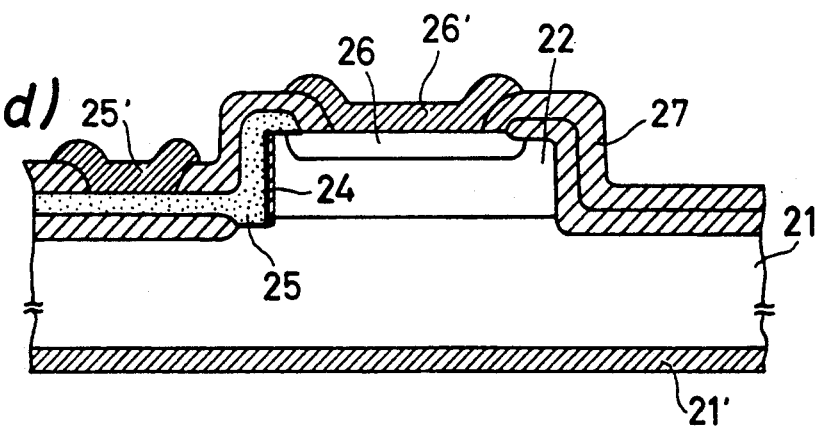
Figure 3:
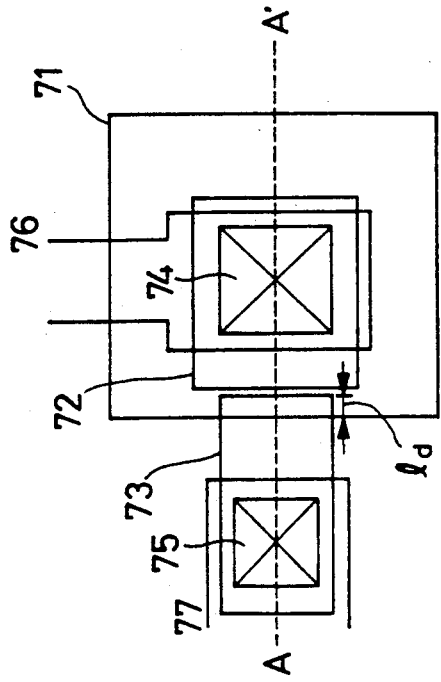
FIG. 3 is a plan view showing a plane construction of a conventional step-cut insulated gate static induction transistor.

FIG. 5 shows one embodiment of the fabrication process, according to this invention, of the step-cut insulated gate static induction transistor shown in FIG. 1.

FIG. 5 (a)

An epitaxial layer 52 constituting a channel is grown on a semiconductor substrate 51 used as a drain, a channel impurity is introduced therein by thermal diffusion or ion implantation and thereafter a U-shaped groove is formed in a main surface of a semiconductor substrate by anisotropic plasma etching or the like.

FIG. 5 (b)

A mask material 53 for selective oxidation is deposited, and conventional photolithography and anisotropic plasma etching are combined to leave mask material on a region as a source of the main surface of a semiconductor substrate and on a region as a gate of the side wall of a U-shaped groove.

FIG. 5 (c)

A selective oxidation is used to form a field oxide film 55, and at the same time a window is formed in a region as a source of the main surface of a semiconductor substrate and in a region as a gate of the side wall of a U-shaped groove to form a gate oxide film 54.

FIG. 5 (d)

A polycrystalline silicon 5 constituting a gate electrode is deposited and then subjected to etching so as to be left on a gate oxide film 54 of the side wall of a U-shaped groove by conventional photolithography after which a source region 57 is formed by thermal diffusion or ion implantation.

FIG. 5 (e)

A passivation film 58 is deposited and a contact hole is made to form a drain electrode 51', a gate electrode 56' and a source electrode 57'.

In this case, the impurity concentration of a drain region 51 and a source region 57 is of the order of $10^{18}$ to $10^{21} cm^{-3}$. Of course, the conductivity type can be either P type or N type, and the region designated by reference number 51 can be used as a source region and the region designated by reference number 57 as a drain region. The impurity concentration of the channel region 52 is of the order of $10^{12}$ to $10^{16}$, and the conductivity type thereof can be the same as or opposite to that of the drain region 51 and source region 57, and a multilayer construction can be employed. However, at least a part of the operating condition, the impurity concentration, as well as the depth of the U-shaped groove are determined so that a depletion layer spread from the drain region reaches the source region. The thickness of the gate oxide film 54 is set to approximately 100 to 1,000 Å.

Figure 4A:
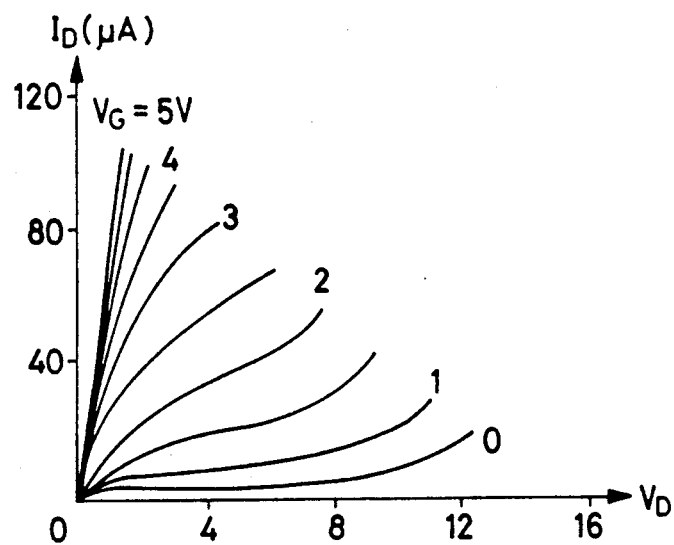
FIGS. 4(a) to 4(c) are characteristic views showing one example of the drain current - drain voltage characteristics caused by a difference of mask alignment margin of a conventional step-cut insulated gate static induction transistor.
Figure 4B:
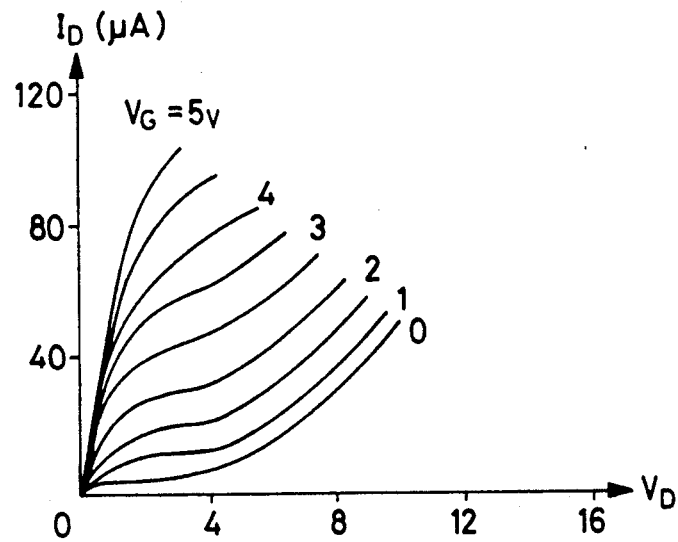
Figure 4C:
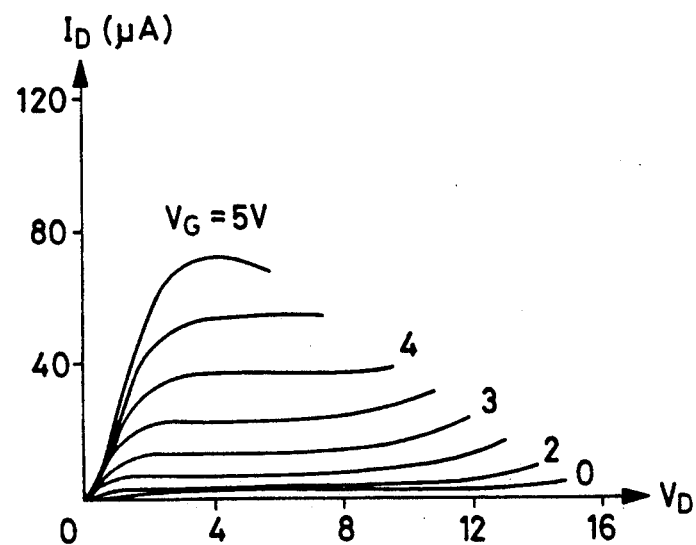
Figure 5A:
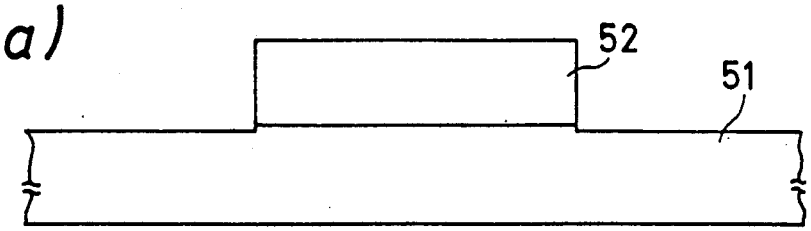
FIGS. 5(a) to 5(e) are explanatory views of the fabrication process showing one embodiment of a method of manufacturing a step-cut insulated gate static induction transistor according to this invention.
Figure 5B:
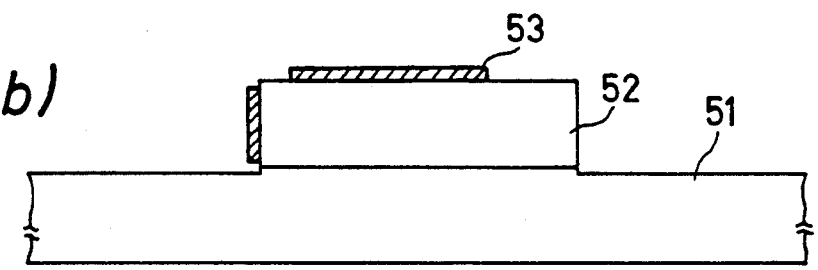
Figure 5C:
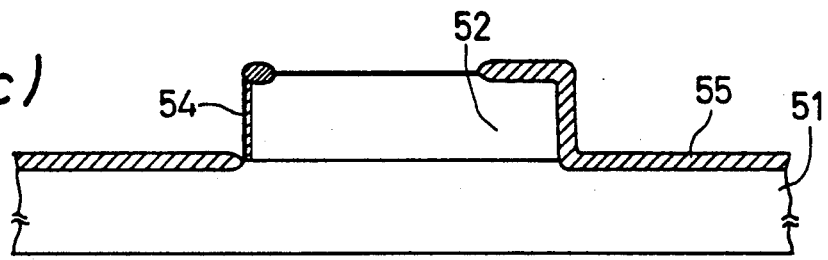
Figure 5D:
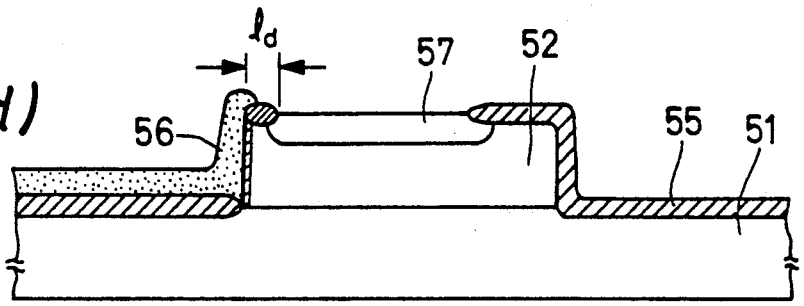
Figure 5E:
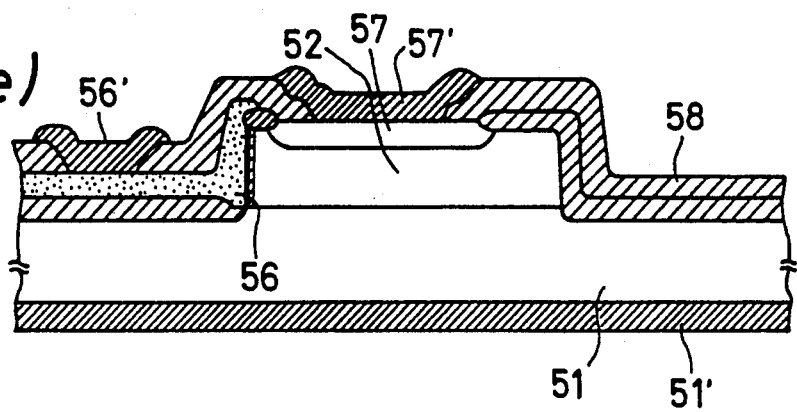
Figure 6A:
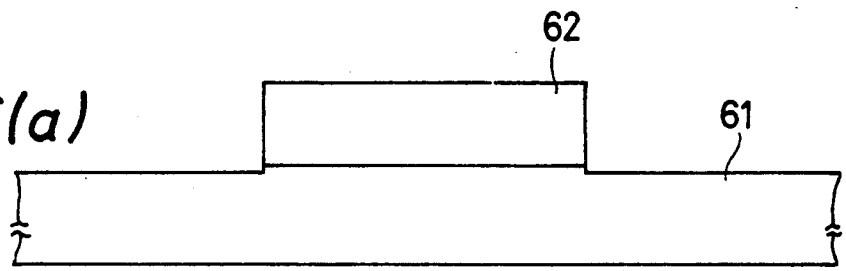
FIGS. 6(a) to 6(d) are detailed explanatory views of the process of forming a mask material.
Figure 6B:
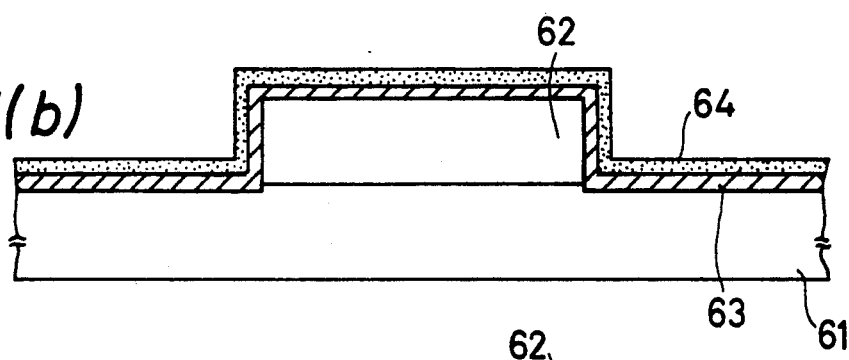
Figure 6C:
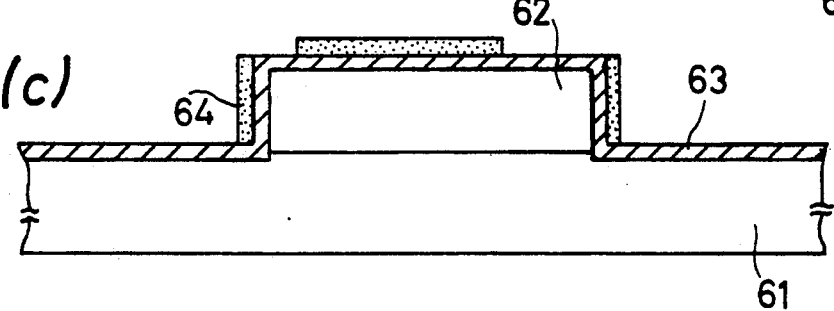
Figure 6D:
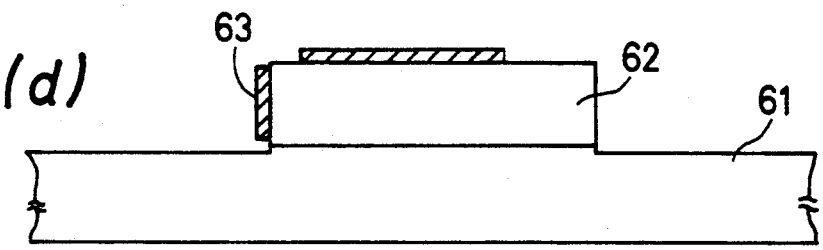

According to this fabrication process, a gate oxide film 54 which has most influence on the characteristic of the device can be self-adjustably formed only on the side wall of the U-shaped groove, and therefore, a step-cut insulated gate static induction transistor can be obtained which is excellent in reproducibility and reliability and has a drain current - drain voltage characteristic as shown in FIG. 4 (a).

FIG. 6 further shows in detail the step of forming the mask material 53 shown in FIG. 5 (b).

FIG. 6 (a)

An epitaxial layer 62 constituting a channel is grown on a semiconductor substrate 61 used as a drain; a channel impurity is introduced therein by thermal diffusion or ion implantation; and thereafter a U-shaped groove is formed in a part of the surface of a semiconductor by anisotropic plasma etching or the like.

FIG. 6 (b)

A polycrystalline silicon 24 constituting a mask material for etching of silicon nitride film 63 and a silicon nitride film 63 constituting a mask material for selective oxidation is continuously deposited by CVD method or the like.

FIG. 6 (c)

Conventional photolithography and anisotropic plasma etching are combined to thereby leave a polycrystalline silicon 64 on a region as a source of the main surface of a semiconductor substrate and on a region as a gate of the side wall of the U-shaped groove. The anisotropic plasma etching of the polycrystalline silicon 64 can be made under gas pressure of approximately 0.1 Torr using $PCl_3$, for example.

FIG. 6 (d)

The polycrystalline silicon 64 is used as a mask material to apply etching to a silicon nitride film 63 constituting a mask material for selective oxidation.

By the process as described above, the silicon nitride film which is the mask material for selective oxidation can be self-adjustably formed only on the side wall of the U-shaped groove. Of course, the silicon nitride film can be directly subjected to anisotropic etching but according to this method, etching of a silicon nitride film can be effected by wet etching such as boiled phosphoricacid, etc., without damage.

Figure 7:
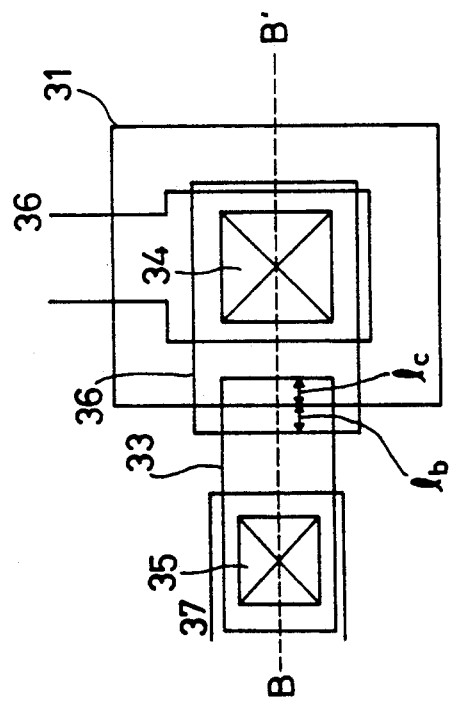
FIG. 7 is a plan view showing a plane construction of a step-cut insulated gate static induction transistor according to the manufacturing method of this invention.

One example of a plane construction of a step-cut insulated gate static induction transistor corresponding to the fabrication process shown in FIGS. 5 and 6 is shown in FIG. 7. In FIG. 7, 71 designates a side wall of a U-shaped groove, 72 a window caused by selective oxidation constituting an active area, 73 a gate electrode of a polycrystalline silicon, 74 and 75 a drain contact hole and a gate contact hole, respectively, and 76 and 77 a drain electrode and a gate electrode, respectively. In FIG. 7, the section taken by A-A' is shown in FIG. 5 (e). Reference label ld denotes the mask alignment margin with respect to the photolithography in the step (d) shown in FIG. 5, the margin being normally set to approximately 0.1 μm to 2 μm. However, this part is a thick field oxide film, and so even if it is superposed to the gate electrode, no significant influence is extended to device characteristic.

Figure 8:
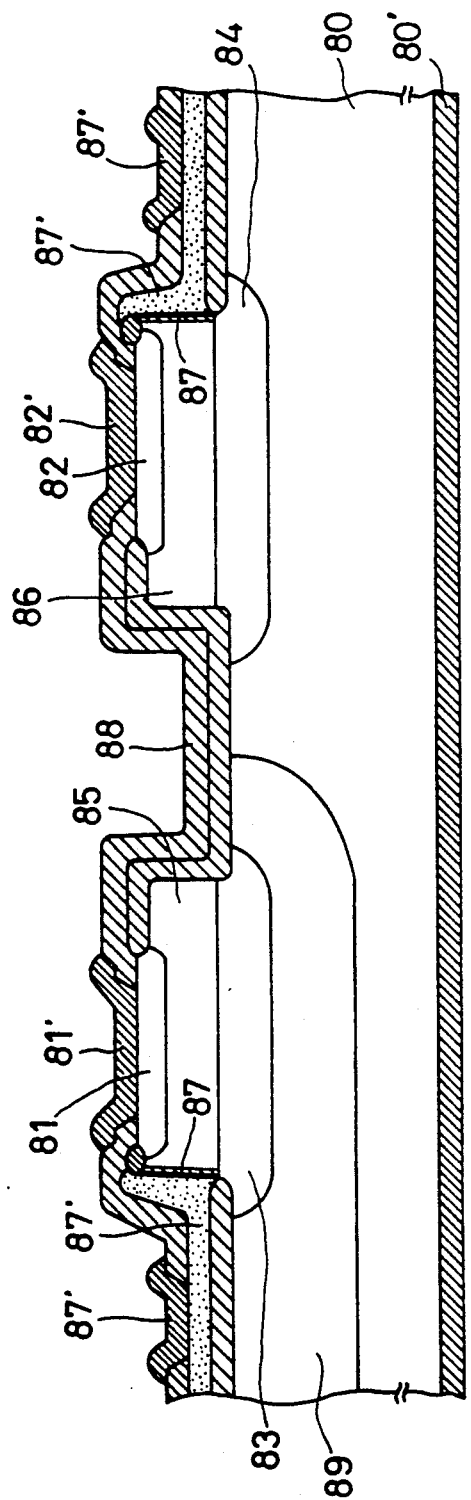
FIG. 8 is a sectional view showing one embodiment of an integrated circuit of a step-cut insulated gate static induction transistor according to the manufacturing method of this invention.

One example of a sectional construction of a innerter gate in the case where the step-cut insulated gate static induction transistor is applied to a complementary metal-oxide-semiconductor transistor integrated circuit is shown in FIG. 8. In FIG. 8, reference number 80 designates a semiconductor substrate, and the main surface thereof is partly formed with a U-shaped groove. Reference number 81 designates an N+ drain region, 82 a P+ drain region, 83 an N+ source region, and 84 a P+ source region, these regions having the impurity concentration of approximately $10^{18}$ to $10^{21} cm^{-3}$. Reference number 85 designates a P channel region and 86 an N channel region, these regions having the impurity concentration of approximately $10^{12}$ to $10^{16} cm^{-3}$. At least in a part of the operating condition, the impurity concentration, as well as the depth of the U-shaped groove are determined so that a depletion layer spread from the drain region reaches the source region. Reference number 87 designates a gate insulator such as an oxide film which has a thickness of approximately 100 to 1,000 Å, 87' refers to a gate electrode, and 88 refers to a field oxide film. Reference number 89 designates a P well for separating a P channel transistor from an N channel transistor. The gate electrode 87' comprises a logical input while the drain electrodes 81' and 82' comprise a logical output, a power-supplied voltage being applied to source electrodes connected to the source regions 3 and 84, respectively. When the logical input is in a high level, the N channel transistor assumes an on state while the P channel transistor assumes an off state, and therefore the logical output is a low level. The same is true for the reversed case.

Even such an integrated circuit can be manufactured nearly similarly to the fabrication process shown in FIG. 5 except for the construction of the substrate, thus providing a complementary metal-oxide-semiconductor transistor integrated circuit which has a good reproducibility and reliability and has high speed and low power. For example, a propagation delay time of 430 psec is obtained at a dissipation power of 10 mW, by a ring oscillator of the complementary metal-oxide-semiconductor transistor integrated circuit shown in FIG. 8.

As described above, the present invention improves the disadvantages encountered in the conventional fabrication process of a step-cut insulated gate static induction transistor, whereby a gate oxide film and a gate electrode can be self-adjustably formed only on the side wall of the U-shaped groove. Accordingly, the step-cut insulated gate static induction transistor which can effect high speed switching and the high speed and low power step-cut insulated gate static induction transistor integrated circuit can be manufactured with good reproducibility and reliability, thus providing a great industrial value.

Embodiment 2

(Construction)

Figure 9A:
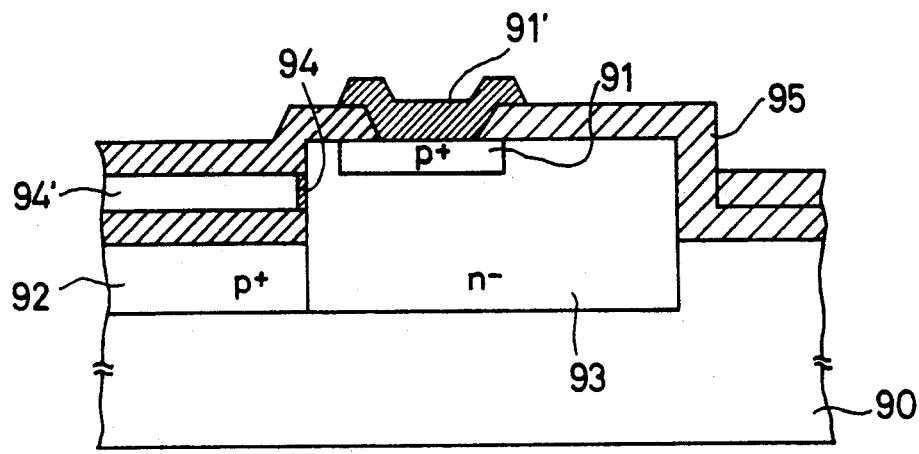
FIGS. 9(a) and 9(b) shows one example of an improved step-cut insulated gate static induction transistor, FIG. 9 (a) being a sectional structural view, and FIG. 9 (b) showing one example of the drain current - drain voltage characteristics.
Figure 9B:
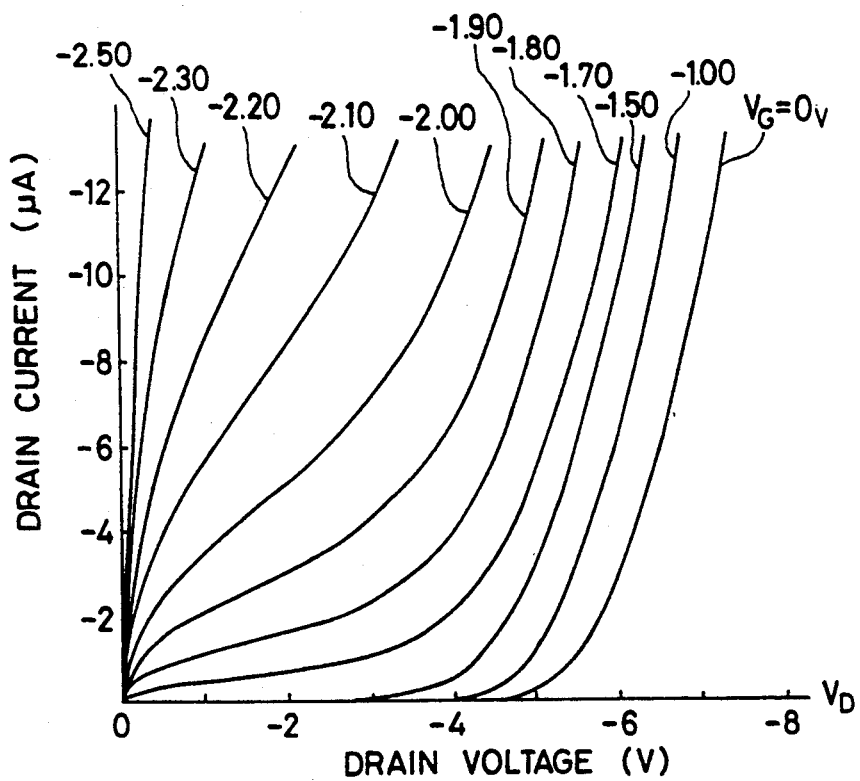

FIG. 9 (a) shows one example of a sectional construction of an improved step-cut insulated gate static induction transistor. In this figure, reference number 90 designates a semiconductor substrate, the main surface of which is partly provided with a U-shaped groove. In this U-shaped groove, a drain region 91 and a channel region 93 are provided depthwise from the main surface along the side wall, a drain electrode 91' being connected to the drain region 91. A source region 92 is provided in contact with the lower end of the side wall of the U-shaped groove and along the bottom of said groove so as not to provide a portion opposed to the drain region. The source electrode though not shown is provided, for example, vertically as viewed from the paper surface. The drain region 91 and the source region 92 have the impurity concentration which is of the order of $10^{18}$ to $10^{21} cm^{-3}$, and the conductivity type shown is the P type, but the N type can be used. Also, the region 91 can be used as a source region, and the region 92 as a drain region. The channel region 93 has the impurity concentration which is of the order of $10^{12}$ to $10^{16} cm^{-3}$. The conductivity type can be of the same as or opposite to the drain region 91 and the source region 92, and a multi-layer construction can be used. Also, it may have the impurity distribution which decreases toward the drain region, but at least in a part of the operating condition, the impurity concentration as well as the depth of the U-shaped groove are determined so that a depletion layer spread from the drain region 91 reaches the source region 92. A gate insulator 94 such as an oxide film is provided in contact with the channel region 93 and has a thickness of the order of 100 to 1,000Å.

A gate electrode 94' formed of metal or polycrystalline silicon or the like is provided opposite to the gate insulator film 94. Reference number 95 designates a field oxide film.

In this construction, the drain region 91 and the source region 92 have no portion opposed to the channel region 93 sandwiched therebetween, unlike the prior art. Accordingly, the drain field on the bulk side is alleviated as compared with the prior art type to increase the breakdown voltage between the drain and the source and decrease a leak current. FIG. 9 (b) shows the drain voltage - drain current characteristics of the step-cut insulated gate static induction transistor according to the present construction. In this case, it is designed so that the channel length is approximately 0.5 μm, the dosage of the channel impurity is approximately $5 \times 10^{12} cm^{-2}$, and the thickness of the gate oxide film is approximately 250 Å. It is understood from FIG. 9 (b) that even in the impurity concentration of the channel lower than the prior art, a leak current between the drain and the source is reduced.

Figure 10:
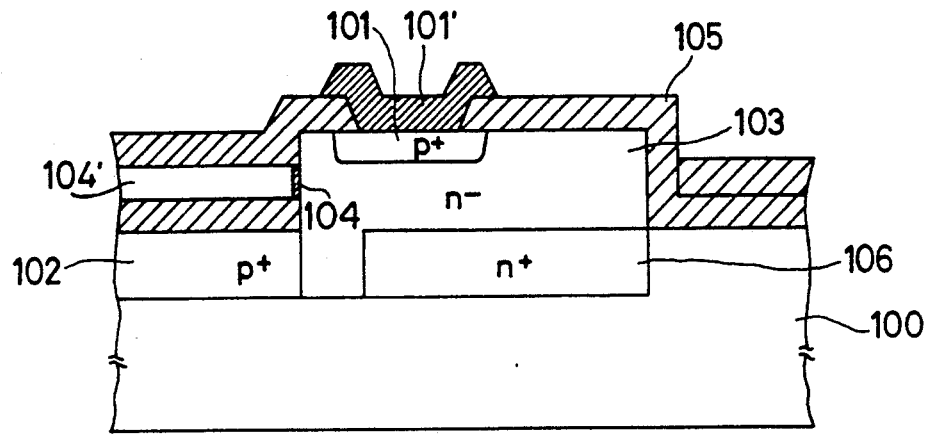
FIG. 10 is a sectional structural view of another example of an improved step-cut insulated gate static induction transistor.

FIG. 10 shows an example of a sectional construction of another step-cut insulated static induction transistor according to the present invention. A semiconductor substrate 100, a drain region 101, a source region 102, a channel region 103, a drain electrode 101', a gate insulated film 104, a gate electrode 104', and a field oxide film 105 are arranged similarly to those shown in FIG. 9 (a). It is designed so that a leak current between the drain and the source is further suppressed by the semiconductor substrate 100. This embodiment is characterized in that a high impurity concentration region 106 having the conductivity type opposite to that of the drain 101 is embedded in the vicinity of the source region 102.

Figure 11:
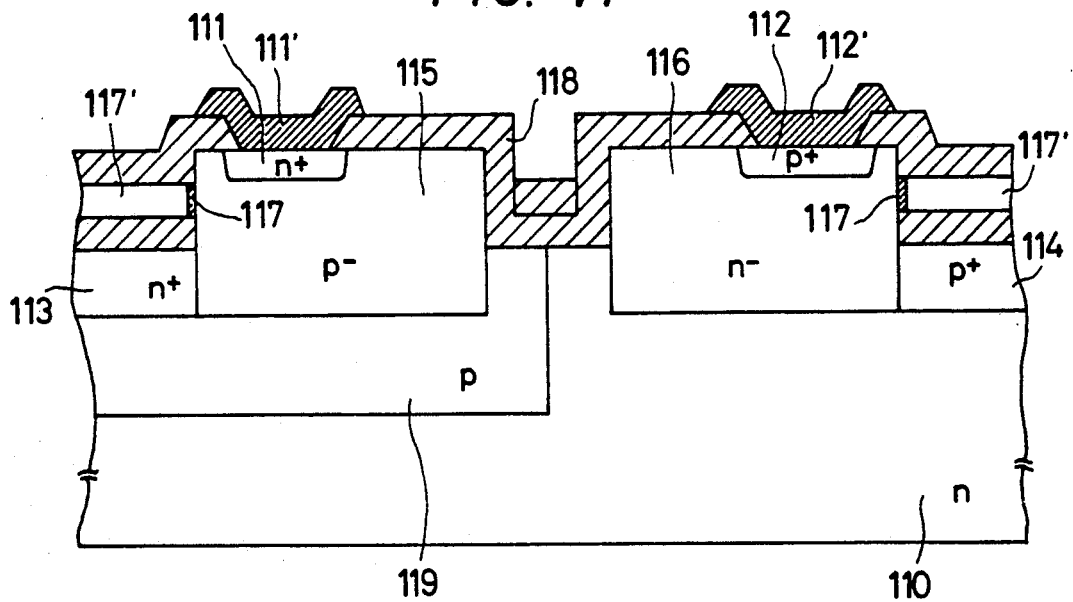
FIG. 11 is a sectional view showing one example of an integrated circuit of an improved step-cut insulated gate static induction transistor.
Figure 12A:
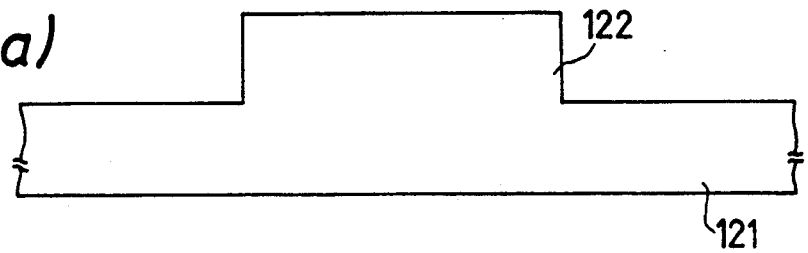
FIGS. 12(a) to 12(d) are explanatory views of the fabrication process of an improved step-cut insulated gate static induction transistor according to a method of manufacturing a step-cut insulated gate static induction transistor of this invention.
Figure 12B:
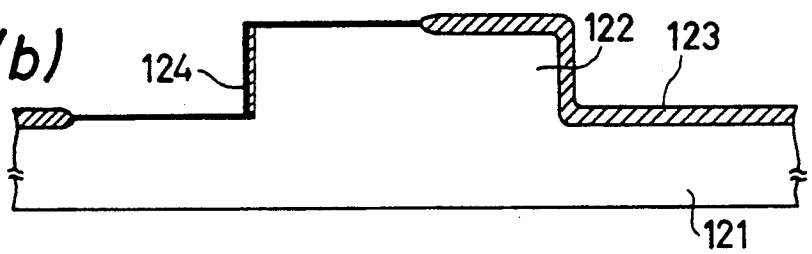
Figure 12C:
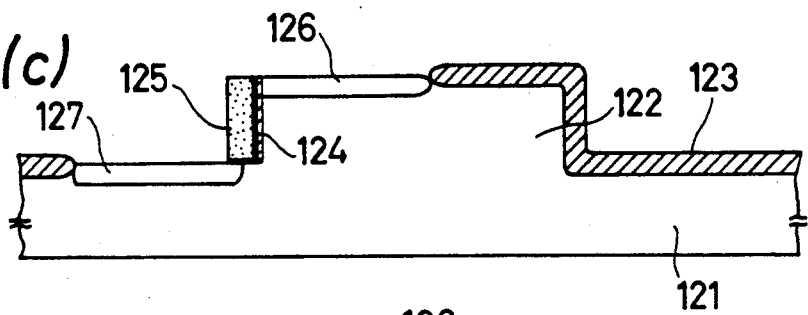
Figure 12D:
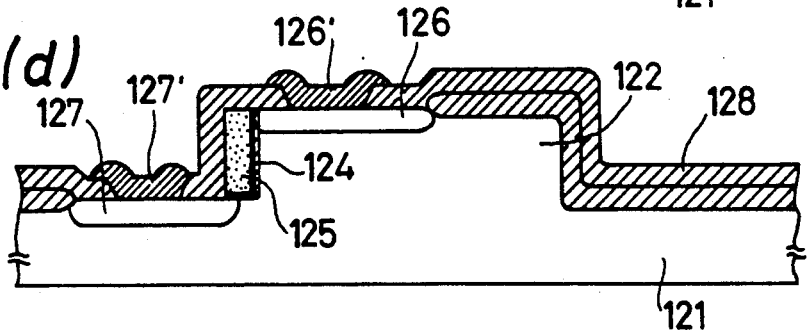

FIG. 11 shows a sectional construction of an inner to gate in which the step-cut insulated gate static induction transistor according to the present invention is applied to a complementary metal-oxide-semiconductor transistor integrated circuit. An N channel transistor in a semiconductor substrate 110 has an n+ drain region 111, an n+ source region 113, a p channel region 115, a drain electrode 111', a gate insulator 117 and a gate electrode 117' while a p channel transistor has a p+ drain region 112, a p+ source region 114, an n channel region 116, a drain electrode 112', a gate insulator 117 and a gate electrode 117'. The n+ drain region 111, p+ drain region 112, n+ source region 113, p+ source region 114 have the impurity concentration of the order of $10^{18}$ to $10^{21} cm^{-3}$. The p channel region 115 and the n channel region 116 have the impurity concentration of the order of $10^{12}$ to $10^{16} cm^{-3}$, and the impurity concentration as well as the depth of the U-shaped groove are determined so that at least in a part of the operating condition a depletion layer spread from the drain regions 111 and 112 reaches the source regions 113 and 114. The gate insulator 117 such as an oxide film has the thickness of the order of 100 to 1,000 Å. In the figure, 118 denotes a field oxide film. A p well 119 is provided to separate the p channel transistor from the N channel transistor. The gate electrode 117' comprises a logical input while the drain electrodes 111' and 112' comprise a logical output, a power supplied voltage being applied to source electrodes connected to the source regions 113 and 114, respectively. When the logical input is in a high level the N channel transistor assumes the on state while the P channel transistor assumes the off state, and therefore the logical output becomes a low level. The same is true for the reverse case.

Even if, the shorter channel is attained to easily extend the static induction effect of the drain voltage to the source region so as to increase the drivability of the device, since the step-cut insulated gate static induction transistor of the present invention is designed so that the drain region and the source region are not superposed with the channel region sandwiched therebetween, a leak current at the off state can be decreased and a standby power can be reduced. Accordingly, it is possible to provide a high speed and low power complementary metal-oxide-semiconductor transistor integrated circuit. For example, a propagation delay time of 63 psec is obtained at a dissipation power of 3.9 mW, by a ring oscillator of the complementary metal-oxide-semiconductor transistor integrated circuit shown in FIG. 11.

As described above, in this construction, the disadvantages encountered in the conventional step-cut insulated gate static induction transistor are overcome whereby even in the case where the shorter channel is attained and the static induction effect of the drain voltage is sufficiently obtained, unnecessary current between the drain and the source may be decreased. Accordingly, a step-cut insulated gate static induction transistor which can perform high speed switching and is less consuming power can be provided, and this transistor can be used to provide a high speed and low power-consumed insulated gate transistor integrated circuit thus providing a great industrial value. (Manufacturing method)

FIG. 12 shows one example of a process of manufacturing for the aforesaid step-cut insulated gate static induction transistor.

FIG. 12 (a)

An epitaxial layer 122 constituting a channel is grown on a semiconductor substrate 121, a channel impurity is introduced therein by thermal diffusion or ion implantation, and thereafter a U-shaped groove is formed in a part of the main surface of the semiconductor substrate by anisotropic plasma etching or the like.

FIG. 12 (b)

The selective oxidation is used to form a field oxide film 123, and at the same time a window is formed in an active area of the main surface of the semiconductor substrate to form a gate oxide film 124.

FIG. 12 (c)

A polycrystalline silicon 125 constituting a gate electrode is deposited, a gate electrode is self-adjustably formed only on the side wall of a U-shaped groove by anisotropic plasma etching or the like, and thereafter this gate electrode 125 is used as a mask to form a drain region 126 and a source region 127 by thermal diffusion and ion implantation.

FIG. 12 (d)

A passivation film 128 is deposited and a contact hole is opened to form a drain electrode 126' and a source electrode 127'.

In this case, the impurity concentration of the drain region 126 and source region 127 is of the order of $10^{18}$ to $10^{21}$cm$^{-3}$. Of course, the conductivity type can be either P type or N type, and the region designated as reference number 126 can be employed as a source region, and the 127 as a drain region. The impurity concentration of the channel region 122 is of the order of $10^{12}$ to $10^{16}$cm$^{-3}$, and the conductivity type thereof can be the same as or opposite to that of the drain region 126 and source region 127, and a multilayer construction can be also employed. However, at least in a part of the operating condition, the impurity concentration and the depth of the U-shaped groove are determined so that a depletion layer spread from the drain region reaches the source region. The thickness of the gate oxide film 124 is set to 100 to 1,000 Å or so, and the thickness of the gate electrode is set to approximately 1,000 Å to 1 μm. For example, it is very advantageous for a polycrystalline silicon to be used for a gate electrode. Anisotropic etching may be conducted by PCl$_3$ plasma etching with pressure being of the order of 0.03 Torr to 0.2 Torr.

According to the aforesaid manufacturing process, a gate oxide film which greatly influences the characteristic of the device and a gate electrode can be self-adjustably formed only on the side wall of the U-shaped groove, thus providing a step-cut insulated gate static induction transistor which has good reproducibility and reliability and has the drain current - drain voltage characteristic as shown in FIG. 4 (a).

Figure 13:
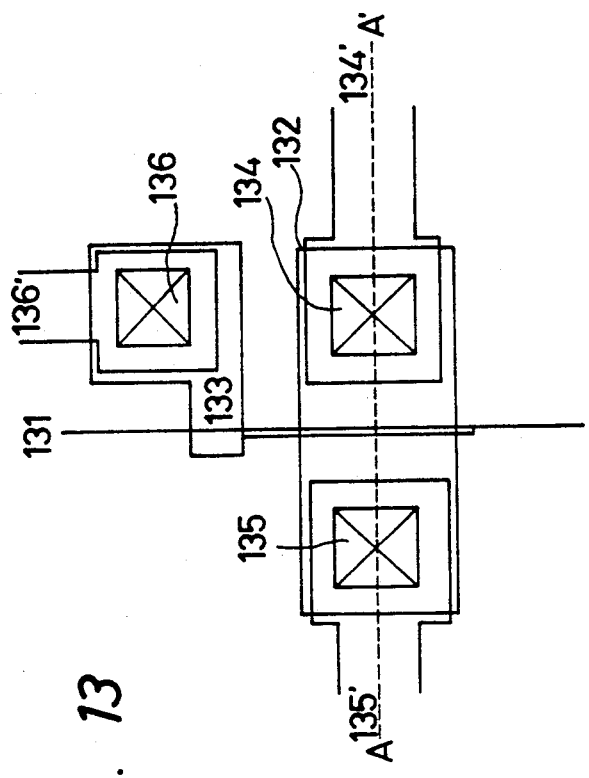
FIG. 13 is a plan view shows a plane construction thereof.

FIG. 13 shows one example of a plane construction of a step-cut insulated gate static induction transistor corresponding to the manufacturing process shown in FIG. 12. In this figure, reference number 131 designates a U-shaped groove side wall, 132 refers to a window obtained by selective oxidation constituting an active area, 133 refers to a gate electrode formed from a polycrystalline silicon 134, 135 and 136 a drain contact hole, a source contact hole and a gate contact hole, respectively, 134', 135' and 136' a drain electrode, a source electrode and a gate electrode, respectively. In the figure, the section taken on A-A' is shown in FIG. 12 (d). Since the active area is all self-adjustably formed with respect to the side wall of the U-shaped groove, a step-cut insulated gate static induction transistor which has a good reproducibility can be manufactured.

Figure 14:
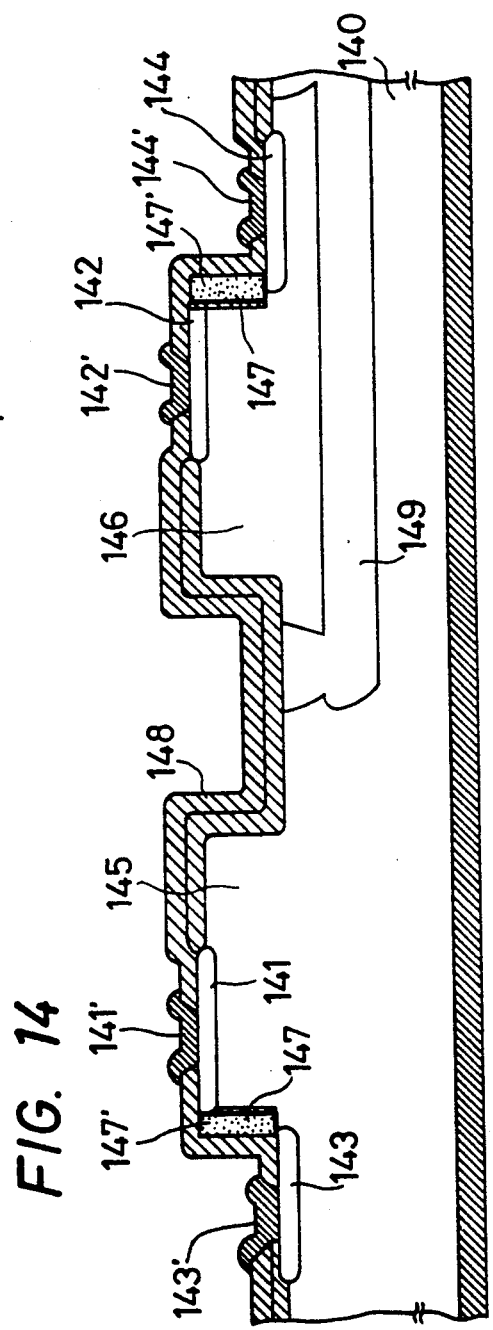
FIG. 14 is a sectional view shows one example of an integrated circuit manufactured by this method.

FIG. 14 shows one example of a sectional construction of one gate in which the aforesaid step-cut insulated gate static induction transistor is applied to a complementary metal-oxide-semiconductor transistor integrated circuit. In this figure, reference number 140 designates a semiconductor substrate, the main surface of which is partly provided with a U-shaped groove. Reference number 141 designates an N+ drain region, 142 a P+ drain region, 143 an N+ source region, and 144 a P+ source region, and these regions have the impurity concentration of the order of $10^{18}$ to $10^{21}$cm$^{-3}$. Reference number 145 designates a P channel region and 146 an N channel region, and these regions have the impurity concentration of the order of $10^{12}$ to $10^{16}$cm$^{-3}$. At least in a part of the operating condition, the impurity concentration and the depth of the U-shaped groove are determined so that a depletion layer spread from the drain region reaches the source region. Reference number 147 designates a gate insulator such as an oxide film and has a thickness of approximately 100 to 1,000 Å, 147' a gate electrode, and 148 a field oxide film. Reference number 149 designates an N type a berried layer for separating P channel transistor from N channel transistor. The gate electrode 147' comprises a logical input and the drain electrode 141' comprises a logical output, a power supplied voltage being applied between the source electrodes 143' and 144'. When the logical input is in a high level, the N channel transistor assumes an on state while the P channel transistor assumes an off state, and therefore the logical output becomes a low level. The same is true for the reversed case.

Even such an integrated circuit can be manufactured nearly similarly to the manufacturing process shown in FIG. 12, except the construction of the substrate, and a high speed and low power complementary metal-oxide-semiconductor transistor integrated circuit may be provided with high reproducibility and reliability. For example, propagation delay time of 63 psec is obtained at a dissipation power of 3.9 mW, by a ring oscillator of the complementary metal-oxide-semiconductor transistor integrated circuit shown in FIG. 14.

Embodiment 3

(Construction)

Figure 15A:
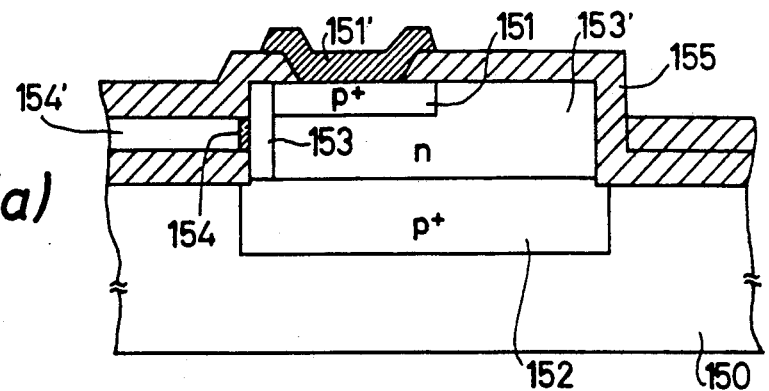
FIGS. 15(a) and 15(b) show a further example of an improved step-cut insulated gate static induction transistor, FIG. 15 (a) being a sectional structural view, and FIG. 15 (b) showing one example of the drain current - drain voltage characteristics.
Figure 15B:
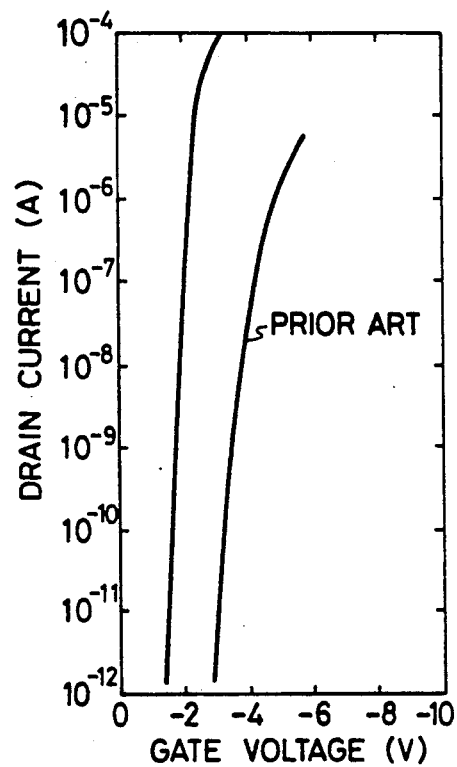

FIG. 15 (a) shows one example of a sectional construction of a further improved step-cut insulated gate static induction transistor. In this figure, reference number 150 designates a semiconductor substrate, the main surface of which is partly provided with a U-shaped groove. A drain region 151 is provided in the main surface so as to contact the upper end of the side wall of the U-shaped groove, and a source region 152 is provided so as to contact the lower end of the side wall of the U-shaped groove, a drain electrode 151' being connected to the drain region 151. A source electrode though not shown is provided, for example, vertically as viewed from the paper surface. The drain region 151 and source region 152 have the impurity concentration of the order of $10^{18}$ to $10^{21} cm^{-3}$, and the conductivity type shown is p type but n type can also be employed. The region 151 can be used as a source region and the region 152 can be used as a drain region. The channel 153 is provided in the vicinity of the surface of the side wall of the U-shaped groove and has the impurity concentration of the order of $10^{12}$ to $10^{16}$. The conductivity type can be the same as or opposite to that of the drain region 151 and source region 152. However, at least in a part of the operating condition, the conductivity type, the impurity concentration and the depth of the U-shaped groove are determined so that a depletion layer spread from the drain region 151 reaches the source region 152. A channel region 153' on the bulk side is provided adjacent to the channel region 153 and between the drain region 151 and the source region 152, and has the conductivity type opposite to that of the drain region 151 and the source region 152, and the impurity concentration thereof is set so as not to flow a current between the drain and the source under the influence of the drain electric field. A gate insulator 154, such as an oxide film is provided in contact with the channel region 153 and has a thickness in the order of 100 to 1,000 Å. Opposite to the gate insulator 154 is provided a gate electrode 154' formed from metal or polycrystalline silicon or the like. Reference number 155 in FIG. 15 (a) designates a field oxide film.

Such a channel region 153 in the vicinity of the side wall of the U-shaped groove can be formed by the epitaxial growth after the U-shaped groove has been formed, and also the thickness can be precisely controlled with the growth. More particularly, with the growing method, if the molecular layer epitaxy (MLE) is used, the low-temperature growing can be effected. Therefore, redistribution of impurities is small, and the precision of the growth is enhanced up to the order of one molecular layer.

FIG. 15 (b) shows the gate voltage - drain current characteristics of the step-cut insulated gate static induction transistor according to the present invention in comparison to the prior art. In this case, it is designed so that the channel length is approximately 0.5 μm, the dosage of the channel impurity on the bulk side is approximately $4 \times 10^{13} cm^{-2}$, and the thickness of the gate oxide film is 250 Å. The channel region adjacent the side wall of the U-shaped groove is formed by the low-pressure epitaxial growth. Even in the impurity concentration of the channel on the bulk side is same as that of the prior art, a threshold voltage can be reduced.

Figure 16:
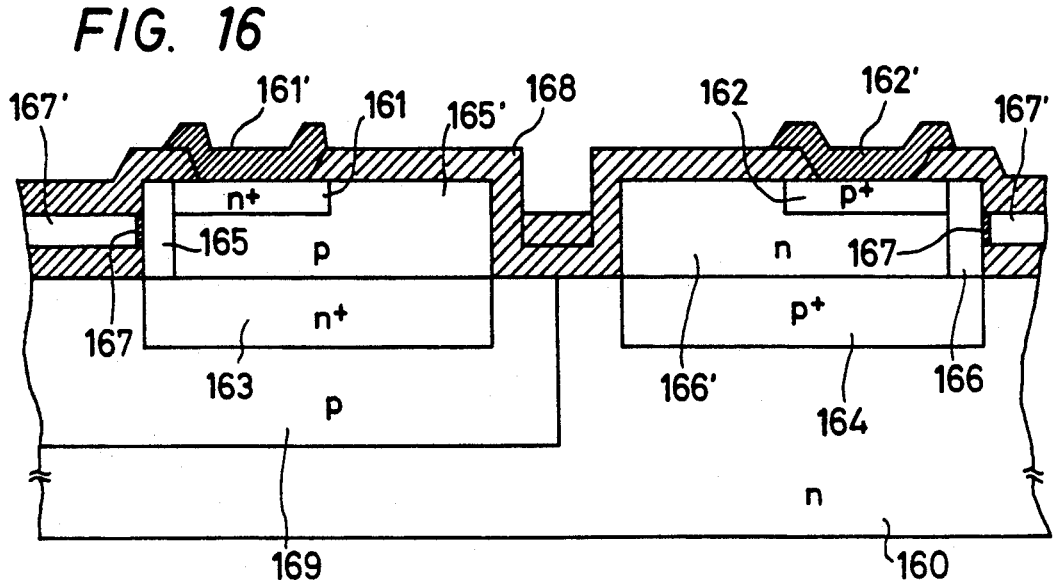
FIG. 16 is a sectional view showing one example of an integrated circuit of an improved step-cut insulated gate static induction transistor.
Figure 17A:
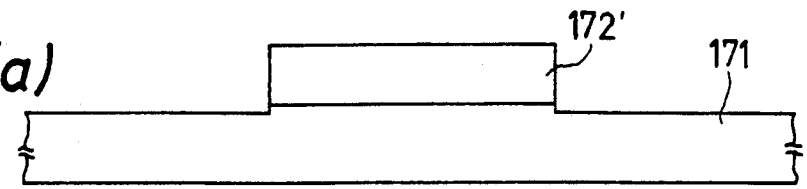
FIG. 17(a) to 17(f) are explanatory views of the fabrication process of an improved undercut insulated gate electrostatic induction transistor according to the manufacturing method of this invention.
Figure 17B:
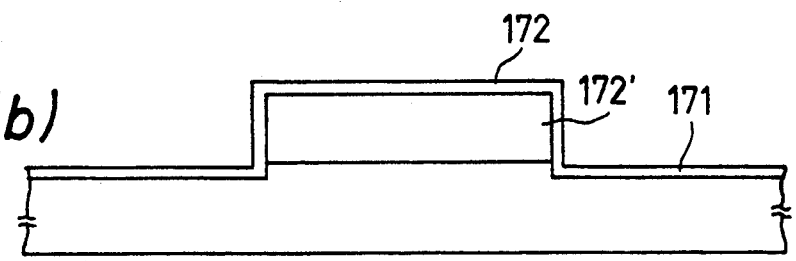
Figure 17C:
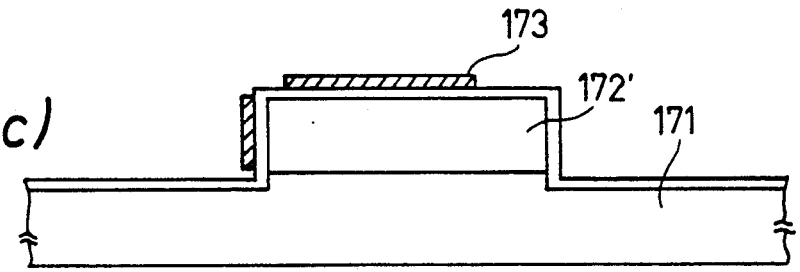
Figure 17D:
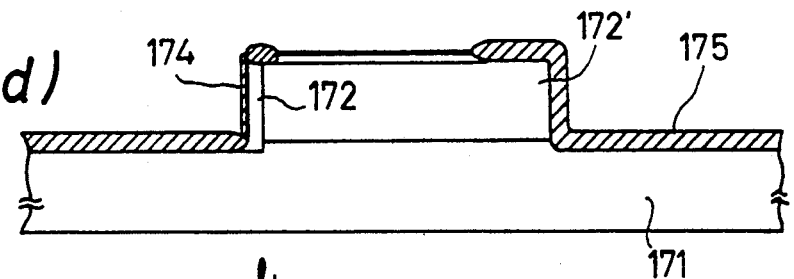
Figure 17E:
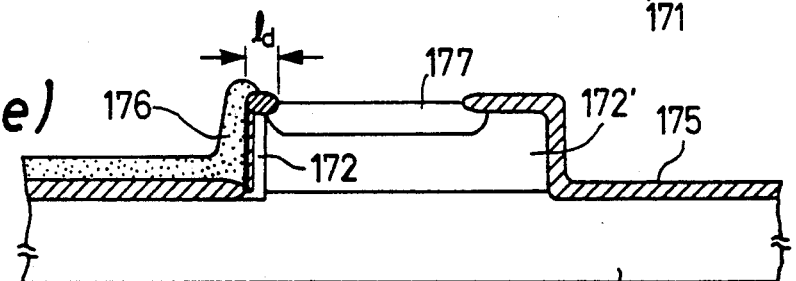
Figure 17F:
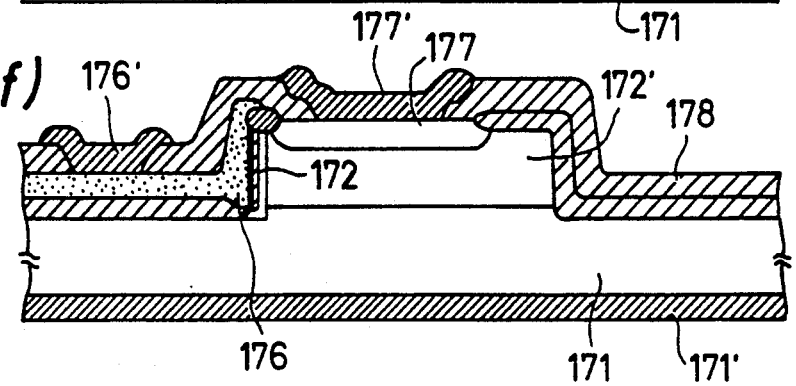

FIG. 16 shows an sectional construction of a inverter gate in which the step-cut insulated gate static induction transistor according to the present invention is applied to a complementary metal-oxide-semiconductor transistor integrated circuit. An N channel transistor in a semiconductor substrate 160 comprises an n+ drain region 161, an n+ source region 163, a channel region 165, a channel region 165' on the bulk side, a drain electrode 161', a gate insulator 167, and a gate electrode 167' whereas a P channel transistor comprises a p+ drain region 162, a p+ source region 164, a channel region 166, a channel region 166' on the bulk side, a drain electrode 162', a gate insulator 167, and a gate electrode 167'. The n+ drain region, p+ drain region 162, n+ source region 163 and p+ source region 164 have the impurity concentration in the order of the $10^{18}$ to $10^{21} cm^{-3}$. The channel regions 165 and 166 have the impurity concentration in the order of $10^{12}$ to $10^{16} cm^{-3}$, and at least in a part of the operating condition the impurity concentration as well as the depth of the U-shaped groove are determined so that a depletion layer spread from the drain regions 161 and 162 reaches the source regions 163 and 164. The channel regions 165' and 166' on the bulk side have the conductivity type opposite to that of the drain regions 161 and 162 and the source regions 163 and 164 (thus, the region 165' is p type, and the region 166' is an n type), and the impurity concentrations are determined so that a current component flowing through these regions does not flow under the influence of the drain electric field. A gate insulated film 167 such as an oxide film has a thickness in the order of 100 to 1,000 Å. In the figure, 168 denotes a field oxide film. There is provided a p well 169 for separating the p channel transistor from the N channel transistor. The gate electrode 167' comprises a logical input while the drain electrodes 161' and 162' comprise a logical output, a power supplied voltage being applied to source electrodes connected to the source regions 163 and 164, respectively. When the logical input is in a high level, the N channel transistor assumes an on state while the P channel transistor assumes an off state, and therefore, the logical output becomes a low level. The same is true for the reversed case.

Even if the shorter channel is attained so as to easily extend the static induction effect of the drain voltage to the source region to increase the drivability of the device, the step-cut insulated gate static induction transistor according to the present invention is able to minimize a leakage current at the off stock and reduce a standby power by suitable selection of the impurity concentration of the channel regions 165' and 166' on the bulk side. Accordingly, it is possible to provide a high speed and low power complementary metal-oxide-semiconductor transistor integrated circuit. For example, a propagation delay time of 430 psec is obtained at a dissipation power of 10 mW, by a ring oscillator of the complementary metal-oxide-semiconductor transistor integrated circuit shown in FIG. 14.

As described above, in the present invention, the disadvantages encountered in the conventional step-cut insulated gate static induction transistor is overcome, and even when the shorter channel is attained to sufficiently obtain the static induction effect of the drain voltage, unnecessary current between the drain and the source may be decreased. Accordingly, the present invention may provide a step-cut insulated gate static induction transistor which can perform high speed switching. In addition, this transistor can be used to provide a high speed and low power insulated gate transistor integrated circuit, thus providing a great industrial value. (Manufacturing method)

FIG. 17 shows one example of a process of manufacturing a step-cut insulated gate static induction transistor according to this invention.

(a) An epitaxial layer 172' constituting a channel on the bulb side is grown on a semiconductor substrate 171 used as a drain, a channel impurity is introduced therein by thermal diffusion or ion implantation and thereafter, a U-shaped groove is formed in a part of the surface of the semiconductor substrate by anisotropic plasma etching or the like.

(b) An epitaxial layer 172 constituting a channel region adjacent the side wall is grown and a channel impurity is introduced therein by thermal diffusion from a channel on the bulb side region or by oblique ion implantation or the like.

(c) A mask material 173 for selective oxidation is deposited, and the conventional photolithography and anisotropic plasma etching are combined to thereby leave the mask material in a region as a source of the surface of the semiconductor substrate and in a region as a gate of the side wall of the U-shaped groove.

(d) The selective oxidation is used to form a field oxide film 175, and at the same time a window is formed in a region as a source of the surface of the semiconductor and in a region as a gate of the side wall of the U-shaped groove to form a gate oxide film 174.

(e) A polycrystalline silicon 176 constituting a gate electrode is deposited and then subjected to etching so as to leave it on the gate oxide film 174 of the side wall of the U-shaped groove by the conventional photolithography, after which a source region 177 is formed by thermal diffusion or ion implantation.

(f) A passivation film 178 is deposited and a contact hole is made to form a drain electrode 171', a gate electrode 176' and a source electrode 177'.

The drain region 171 and the source region 177 have the impurity concentration of the order of $10^{19}$ to $10^{21}/cm^3$. The conductivity type shown is N type but it is noted of course that P type can be employed. The region designated by reference number 171 can be used as a source region, and the region designated by reference number 177 as a drain region. The impurity concentration of the channel region 172 adjacent the side wall of the U-shaped groove is in the order of $10^{12}$ to $10^{16}/cm^3$, and the conductivity type thereof can be the same as or opposite to that of the drain region and the source region. However, at least in a part of the operating condition, the impurity concentration as well as the depth of the U-shaped groove are determined so that a depletion layer spread from the drain region reaches the source region. The channel region 172 on the bulk side has the conductivity type opposite to that of the drain region and the source region, and the impurity concentration is set so as not to flow a leakage current between the drain and the source under the influence of the drain electric field. The thickness of the gate oxide film 174 is set to approximately 100 to 1,000 Å.

While the invention has been particularly shown and described in reference to preferred embodiments thereof, it will be understood by those skilled in the art that changes in form and details may be made therein without departing from the spirit and scope of the invention.

What is claimed is:

1. A step-cut insulated gate static induction transistor, comprising:
    a U-shaped groove in a main surface of a semiconductor substrate and a drain region having a high impurity concentration provided in said main surface;
    a source region having a high impurity concentration provided along a bottom portion of said U-shaped groove;
    a channel region having a low impurity concentration provided between said drain region and said source region, said source region and said drain region being non-overlapping across said channel region in a depthwise direction when said source region and said drain region are projected onto a plane; and
    an insulated gate structure provided on at least a part of said side wall of said U-shaped groove for controlling a current flowing through said channel region.

2. A step-cut insulated gate static induction transistor according to claim 1, wherein a high impurity concentration region having a conductivity type different from a conductivity type of said drain region and said source region is provided in a vicinity of said source region to thereby restrict a region through which current flows.

3. A step-cut insulated gate static induction transistor according to any one of claims 1 or 2, wherein the drain region can be replaced with the source region.

4. A step-cut insulated gate static induction transistor according to any of claims 1 or 2, wherein said transistor is composed of at least a part of a semiconductor integrated circuit.

5. A step-cut insulated gate static induction transistor, comprising:
    a U-shaped groove in a main surface of a semiconductor substrate and a drain region having a high impurity concentration provided in said main surface;
    a source region having high impurity concentration provided so as to contact at least a part of a lower end of the side wall of said U-shaped groove;
    a first channel region having a low impurity concentration provided in a vicinity of the surface of the side wall of said U-shaped groove;
    a second channel region sandwiched between said drain region and said source region and having the conductivity type different from that of said drain region and said source region, wherein the impurity concentration of the second channel region is set so as to eliminate a current flowing through said second channel region; and
    an insulated gate structure provided on at lest a part of said side wall of said U-shaped groove for controlling a current flowing through said first channel region.

6. A step-cut insulated gate static induction transistor according to claim 5 wherein said first channel region is formed by the epitaxial growth on the side wall of said U-shaped groove.

7. A step-cut insulated gate static induction transistor according to claim 5 or 6 wherein the drain region is replaceable with the source region.

8. A step-cut insulated gate static induction transistor according to any of claim 5 or 6, wherein said transistor is composed of at least a part of a semiconductor integrated circuit.

* * * * *